United States Patent [19]

Kokta

[11] Patent Number: 4,988,402

[45] Date of Patent: * Jan. 29, 1991

[54] PROCESSES FOR ENHANCING FLUORESCENCE OF TUNABLE TITANIUM-DOPED OXIDE LASER CRYSTALS

[75] Inventor: Milan R. Kokta, Washougal, Wash.

[73] Assignee: Union Carbide Chemicals and Plastics Company Inc., Danbury, Conn.

[*] Notice: The portion of the term of this patent subsequent to Jun. 6, 2006 has been disclaimed.

[21] Appl. No.: 287,011

[22] Filed: Dec. 21, 1988

Related U.S. Application Data

[63] Continuation-in-part of Ser. No. 154,033, Feb. 9, 1988, Pat. No. 4,836,953.

[51] Int. Cl.$^5$ ............................................. C30B 15/00
[52] U.S. Cl. ..................................... 156/605; 156/606; 156/620.5; 156/624; 156/DIG. 61; 156/DIG. 75; 156/DIG. 89; 252/301.4 F
[58] Field of Search .................. 156/605, 606, 617.1, 156/618.1, 619.1, 620.5, DIG. 61, DIG. 75, DIG. 89; 501/86, 153; 372/20, 39, 41; 252/301.4 F

[56] References Cited

U.S. PATENT DOCUMENTS

| | | | |
|---|---|---|---|
| 3,715,194 | 2/1973 | Plooster | 156/620.5 |
| 4,038,117 | 7/1977 | Noble et al. | 156/646 |
| 4,587,035 | 5/1986 | Kokta | 252/301.4 F |
| 4,711,696 | 12/1987 | Kokta | 156/617 SP |
| 4,765,925 | 8/1988 | Anzai et al. | 501/86 |
| 4,824,598 | 4/1989 | Stokowski | 372/41 |
| 4,836,953 | 6/1989 | Kokta | 252/301.04 F |

OTHER PUBLICATIONS

Kristall und Technik, vol. 13, No. 4, 1978, pp. 413–421, Berlin, DE; J. Kvapil et al.: "Brown Colour of Ruby". Klassen et al., "Thermal Treatment of Corundum", from *Ruby and Sapphire* Ed. Belyaev 1980 Amerind Pub. New Delhi pp. 315–319.

*Primary Examiner*—John Doll
*Assistant Examiner*—R. Bruce Breneman
*Attorney, Agent, or Firm*—Morris N. Reinisch

[57] ABSTRACT

The Figure of Merit of titanium-doped oxide crystals suitable for use as a tunable laser is enhanced by treating the article at a temperature of about 50° C. to 80° C. below the melting point of the crystal in an atmosphere containing at least about 20 volume percent hydrogen.

8 Claims, No Drawings

PROCESSES FOR ENHANCING FLUORESCENCE OF TUNABLE TITANIUM-DOPED OXIDE LASER CRYSTALS

This invention was made under Government support under Contract No. N66001-86-C-0051 awarded by the Department of the Navy. The Government has certain rights in this invention.

RELATED APPLICATIONS

This application is a continuation-in-part application of pending U.S. application Ser. No. 154,033, filed Feb. 9, 1988, now U.S. Pat. No. 4,836,953, the contents of which are incorporated herein by reference as if set forth in full.

The present invention relates generally to the field of lasers. More particularly, the present invention is related to a process for improving the lasing efficiency of tunable titanium-doped oxide laser crystals.

As used herein, the term "titanium-doped laser crystal" is intended to include oxide monocrystalline materials, that is, an oxide material comprised of a single crystal or two or more single crystals grown together longitudinally but separated by a relatively small angle (usually within 4°, preferably within 1°, determined with respect to the axes of neighboring single crystals) grain boundary having a minor amount of titanium incorporated into the crystalline framework to provide for lasing.

Without wishing to be bound by theory, in order to provide lasing capability to the crystalline material, the titanium must be present in the $Ti^{+3}$ oxidation state with an outer electronic shell configuration of $3D^1$, i.e., the 3d electronic shell contains one unpaired electron. The most stable natural configuration of the titanium ion is, however, $Ti^{+4}$ with an electronic configuration of $3d^0$ (i.e., no unpaired electron in the d shell). Accordingly, an equilibrium exists between the titanium ions in the +3 and +4 states during the formation of the laser crystal.

The ratio between the $Ti^{+3}$ and $Ti^{+4}$ ions is dependent on the electron affinity of the other constituents present in the crystal forming mixture. If the electron affinity of other constituents is high, the portion of $Ti^{+3}$ ions in the mixture will remain high. Conversely, if any of the other crystal forming constituents have low electron affinity, the amount of $Ti^{+3}$ ions available will be low. Generally, there are always $Ti^{+4}$ ions present in the molten mixture of constituents during the growth of the titanium-doped crystals which are caused by the presence of oxygen or reactive oxygen containing species. These $Ti^{+4}$ ions are incorporated into the growing crystals in conjunction with the $Ti^{+3}$ ions.

Still not wishing to be bound by theory, when the laser crystal containing the $Ti^{+3}$ ions is subjected to a pumping light, the sole electron in the 3d electronic shell advantageously absorbs particular wavelengths of this pumping light such that it becomes energized and is shifted to an outer electronic shell, such as the 4f shell. When the electron eventually becomes deenergized, it returns to its original $3d^1$ electronic shell configuration with, however, a concomitant release of light energy. By the use of mirrors at the ends of the laser crystals (a technique which is well known to those skilled in the art), it is possible to control and amplify this light emitting phenomenon so as to produce the desired laser light.

However, concurrently with this desirable absorption of light energy which activates the single electron from the $3d^1$ shell to the higher electronic shells, there is also an unwanted simultaneous absorption of the laser light energy produced by the deactivation of the energized electron from the outer electronic shell to its starting $3d^1$ position.

Still not wishing to be bound by theory, this undesirable absorption of laser light is believed to be caused by the $Ti^{+4}$ ions which are believed to be in the form of $Ti^{+3}:Ti^{+4}$ couples. These couples cause an optical absorption band at longer wavelengths than the absorption band of the $Ti^{+3}$ ions which activate the $3d^1$ electrons. Because the absorption band caused by the presence of $Ti^{+4}$ in the crystal is of longer wavelength than that of the $Ti^{+3}$ ions, it frequently overlaps the lasing wavelength of the $Ti^{+3}$ ion and therefore manifests itself as an optical loss which decreases the energy of the lasing beam. In numerous cases, depending upon the titanium concentration, optical loses reach levels that effectively prevent the crystals from lasing at all.

One useful parameter in reporting the lasing efficiency of the titanium-doped laser is referred to as the "Figure of Merit". The Figure of Merit is the ratio of the transmission (in percent per centimeter) of a crystal at the wavelength at which the unwanted absorption of the laser light occurs relative to the transmission (in percent per centimeter) of the crystal at a wavelength in which the desirable absorption occurs in which the $Ti^{+3}$ ion is activated. Typically, the Figure of Merit for the titanium-doped sapphire crystal is about 30 to 50. For other oxide monocrystalline materials, their Figure of Merit is typically in the range of from about 1 to about 30. The higher the Figure of Merit, the more lasing capability the crystal has.

Tunable solid state laser materials have been known to the art since the early 1960's and $Ti:Al_2O_3$, for example, was disclosed by P. F. Moulton (Laser Focus, May 1983) as a tunable laser material having an effective fluorescence tuning range of 750 to 900 nm. The absorption spectra range for $Ti:Al_2O_3$ has been given as extending up to about 650 nm; however, it has been discovered that unless special precautions are taken in the course of processing titanium-doped sapphire, $Ti:Al_2O_3$, the absorption spectra, while reaching a minimum value at about 650 nm, extends over the entire lasing (fluorescence) range with the undesirable result that lasing efficiency of the tunable $Ti:Al_2O_3$ material is significantly reduced.

Moreover, only relatively small amounts of titanium have been found useful in preparing a crystalline material suitable for use as laser crystals. Even at concentrations of titanium of one percent in the melt, $Ti:Al_2O_3$ crystals, for example, prepared by conventional techniques have an absorption of light in the range of 650 to 1100 nm of over 12 percent per centimeter. Often the undesirable absorption peaks at about 850 nm, in the mid-range of the tunable band.

Accordingly, it is desired to improve the lasing efficiency of tunable titanium-doped crystal lasing materials.

One approach to enhancing the lasing efficiency of tunable titanium-doped sapphire lasing material is disclosed in my U.S. Pat. No. 4,711,696, incorporated herein by reference. The disclosed process involves enhancing the fluoresence of titanium-doped sapphire crystal by the process conditions used in the manufacture of the crystal. In general, the process conditions involve providing precursor mixtures for the crystal under a carbon monoxide-containing atmosphere which is being heated toward melt temperatures. Advantageously, the carbon monoxide is present before the mixture is liquified. Often, the carbon monoxide atmosphere is replaced by a hydrogen-containing atmosphere at the melt temperature and during cooling. Carbon monoxide can degrade at the temperature of the melt, i.e., above about 1600° C. to 2050° C. and higher. The foregoing steps are conducted in a non-reactive ambient atmosphere, e.g., nitrogen, argon or other inert gases, with the reducing gas being provided in the ambient gas atmosphere. The non-reactive atmosphere preferably contains about 5 ppm to 1% by volume hydrogen; however greater concentrations of hydrogen may be used, e.g., 5 ppm to 20 volume percent but are usually avoided in view of the safety concerns.

The crystals prepared by the aforementioned technique do have enhanced and desirable fluorescent characteristics. The processes described in my patent application have yielded titanium-doped sapphire crystals having Figures of Merit of 100 or more, and crystals having Figures of Merit of 60 to 80 are facilely produced. While the crystals produced using the aforementioned process are a considerable improvement over those previously available, a need has been evidenced for titanium-doped laser crystals having even greater Figures of Merit, e.g., 120 and more.

In addition to my foregoing patent, my U.S. Pat. No. 4,587,035 discloses a vacuum annealing treatment of titanium-doped laser crystals to enhance lasing efficiency.

By this invention, I have provided processes for enhancing the Figure of Merit of titanium-doped oxide laser crystals, particularly titanium-doped sapphire laser crystals, such that their Figures of Merit increase by at least 10%, typically at least about 50% and more typically by at least about 100% or more. For sapphire crystals, for example, the Figure of Merit increases to at least about 120, preferably at least to about 200.

In accordance with the processes of the invention, a titanium-doped laser crystal is maintained at a temperature of at least about 1750° C. to a temperature below which the crystal looses its crystallinity, e.g., a temperature of about 50° to 80° C. below the melting point of the particular crystal, in an atmosphere containing sufficient hydrogen for a time sufficient to increase the Figure of Merit of the crystal.

Essentially any oxide crystal which is capable of being doped with titanium in order to provide a lasing effect may be treated in accordance with the processes of the present invention to provide an oxide lasing crystal having a substantially improved Figure of Merit.

Suitable titanium-doped oxide host crystals include, but are not limited to, titanium-doped spinel (Ti:MgAlO$_4$); titanium-doped yttrium aluminate (Ti:YAlO$_3$); titanium-doped yttrium garnate (Ti:Y$_3$Al$_5$O$_{12}$); titanium-doped lanthanum magnesium aluminate (Ti:LaMgAl$_{11}$O$_{19}$); titanium-doped gadolinium scandate (Ti:GdScO$_3$); titanium-doped scandium borate (Ti:ScBO$_3$); and other titanium oxide host crystals, and the like.

Regardless of the host oxide crystal material being used, when the crystal is titanium-doped and treated by the process of the present invention, i.e., heat treated in an inert atmosphere containing hydrogen, the undesirable (parasitic) long wavelength absorption is essentially eliminated producing a titanium-doped lasing oxide crystal with substantially improved Figures of Merit.

The increase in the Figure of Merit for a titanium-doped oxide lasing crystal by the present invention is believed to be caused by reducing the amount of Ti$^{+4}$ ions in the crystal to Ti$^{+3}$ ions as well as by breaking the Ti$^{+3}$:Ti$^{+4}$ couples that are present.

The enhanced crystals provided by the present invention are particularly useful as tunable laser materials having desirable fluorescent characteristics. An aspect of this invention relates to titanium-doped sapphire crystals which exhibit advantageous light transmittance characteristics over the range of 650 nm to 1100 nm. Particularly desirable sapphire laser crystals exhibit a light absorption within this range (often measured at 850 nm) (in percent per centimeter) less than 10, frequently less than 8, preferably less than 5, times the square of the weight percent of titanium in the melt for making the crystal. Thus, for a melt containing 1.5 weight percent titanium, this light absorption will be less than $(1.5)^2(10)$, or 22.5 percent per centimeter. Indeed, in processes in accordance with this invention, crystals made using about 1.5 weight percent titanium in the melt provided a light absorbance of less than about 1 percent per centimeter, typically about 0.6 to about 0.75 percent per centemeter. For sapphire, the Figure of Merit is the ratio of the transmission (in percent per centimeter) of sapphire at a wavelength of 830 nanometers (nm) to its transmission (in percent per centimeter) at a wavelength of 490 nm. By the process of the present invention the Figure of Merit for sapphire increases from about 60 to 80 to at least about 120 to 200 or more. For Ti:MgAlO$_4$, Ti:ScBO$_3$ and Ti:GdScO$_3$, for example, their Figures of Merit may increase from about 1 to 10 to at least about 100 or 150, or more. For Ti:YAlO$_3$ and Ti:Gd$_3$Sc$_2$AlO$_{12}$, for example, their Figures of Merit generally increase from about 10 to 30 to at least about 100 to about 200. Other crystals, after being treated by the method of the present invention also exhibit similar remarkable improvements in their Figures of Merit.

A titanium-doped oxide crystal is frequently made from a melt containing from about 0.02 to 2.0, often 0.02 to 1.0 atomic percent of titanium. The melt is prepared by heating a mixture of high purity TiO$_2$ (less than 50 ppm of Cr, Fe, Si, Ca) and high purity laser host material such as Al$_2$O$_3$, e.g., sapphire "crackle", containing less than 100 ppm of impurities such as Si, Cr, Fe and Mg, at an appropiate melt temperature for that specific host crystal material which for sapphire, for example, is in the range of about 2050° C. to 2080° C.

A titanium-doped lasing crystal can be formed from the melt, e.g., by the well known Czochralski technique and the crystal is cooled to room temperature. In accordance with the process disclosed in my earlier patent application, the crystal can be formed in the presence of a non-reactive ambient atmosphere containing, e.g., about 5 ppm to 1 percent by volume of reducing gas. The reducing gas can be hydrogen; the carbon monoxide used can also be used in accordance with my earlier invention as the reducing gas at temperatures between 800° C. and 1600° C., being replaced by hydrogen for the higher temperature for crystal formation, e.g., 2050° C. The replacement of carbon monoxide at these high temperatures is required to avoid carbon contamination due to decomposition of carbon monoxide.

The processes of this invention may be employed to treat titanium-doped lasing oxide crystals in any convenient form. For instance, the crystal boule as made from the melt may be treated in accordance with this invention as well as any crystal article obtained therefrom such as the crystal in the form of laser rods. Often, the crystal has as its smallest mean cross-sectional thickness of less than about 10 centimeters, preferably less than 5 centimeters. Larger crystals can be used but the treatment may have to be conducted for longer periods of time.

The crystal article to be treated is heated in a hydrogen-containing atmosphere to a temperature of at least about 1750° C. Although lower temperatures can be used, the rate that the Figure of Merit of the crystal is improved is generally too slow to be commercially feasible. The temperature of the crystal article should not be heated to temperatures at which it begins to become noticeably plastic. Once a melt occurs, the generation of oxygen or oxygen-containing species that adversely affect the titanium oxidation state may result. Hence, the maximum temperature for sapphire is generally about 2025° C. Increasing the temperature within this range reduces the time required to provide a given improvement in the Figure of Merit. Thus, temperatures of about 1850° C. to 2025° C., say, about 1900° C. to 2000° C., are frequently employed for sapphire crystals. For other crystals, their respective melting points will dictate the maximum allowable temperature to which they may be heat treated. As with the sapphire, subjecting the titanium-doped oxide crystal to as close as the maximum allowable temperature will generally reduce the time required to provide a given improvement in the Figure of Merit. Generally, the maximum temperature will be about 50° to 80° C. below the melting point of the particular crystal, and preferably about 50° C. below the melting point.

The rate of heating and cooling of the crystal article should be sufficiently slow to avoid inducing undue stress in the article. The rate will therefore depend upon the size and configuration of the article as well as the thermal shock resistance of the particular crystal material. Usually, the heating and cooling rates are less than 50° C. change per hour.

The amount of hydrogen present in the atmosphere will have an effect on the rate that the Figure of Merit improves. Generally, the hydrogen is present in an amount of at least about 20 percent up to 100 percent by volume of the atmosphere. Most preferably, the hydrogen is present in at least about 40, e.g., 50 to 100, preferably 75 to 100, volume percent of the atmosphere. The atmosphere may contain inert components such as nitrogen or argon. The treatment may be conducted at any convenient pressure from subatmospheric to superatmospheric pressure, e.g., 0.001 to 1000 bar. Preferably, the treatment is at a low superatmospheric pressure due to safety considerations, although high total pressures will favor advantageously higher partial pressures of hydrogen. The pressures may often be from about 0.01 to 10 bar gauge.

The concentration of hydrogen and the partial pressure of hydrogen will affect the rate of improvement of the Figure of Merit. In general, the higher the hydrogen concentration, the faster the rate of improvement. At hydrogen concentrations below about 40 volume percent, the rate of improvement can be unduly slow for commercial operations.

The time of the treatment will depend upon the desired Figure of Merit sought for the crystal as well as the temperature and hydrogen concentrations used. Thus, the treatment may be for as little as one hour to weeks or more. Often, to up-grade a sapphire crystal, for example, having a tubular shape and a diameter of about 5 centimeters from a Figure of Merit of about 60 to 80 to a Figure of Merit of 120 or more at a temperature of 1900° C. to 2000° C. and a hydrogen concentration of about 50 volume percent, a duration (soak time) of about 20 to 100 hours, e.g., about 40 to 70 hours, is used.

Preferably, the time is sufficient to increase the Figure of Merit by at least about 10 percent, and most preferably, the crystal, after treatment, has a Figure of Merit of at least about 100, say, at least about 120, and most preferably, at least about 150 or 200. At Figures of Merit above 1000, analytical imprecision can often limit any accuracy in determining the Figure of Merit. The processes of this invention can be used with any titanium-doped oxide crystal having any initial Figure of merit value. Usually, the crystals have an initial Figure of Merit of about 1 to 50, typically about 1 to 10, prior to treatment.

The processes of this invention provide a convenient means for upgrading the fluorescing efficiency of a titanium-doped oxide crystal. Particularly meritorious features of the processes are its efficacy and the ability to upgrade existing titanium-doped oxide articles.

The following examples are provided to further illustrate the invention and are not in limitation thereof.

EXAMPLE 1-2

Various titanium doped sapphire crystals in the form of cylindrical rods are treated in an annealing furnace. The Figure of Merit of each of the crystals is determined before and after the treatment. Tables I and II are directed to sapphire crystals only. Table III is directed to crystals other than sapphire. Table I further describes the crystals and Table II summarizes the treatment conditions and the Figures of Merit for the crystals. Table III sets forth the treatment conditions and results for the crystals other than sapphire. For the examples shown in Table III, the $Ti^{+3}$ content in the melt is about 1% atomic weight. However, due to differences in the Distribution Coefficient for the respective crystals, the amount of $Ti^{+3}$ that ultimately ends up in the crystal is generally about 5 to 10 times lower than the amount present in the melt, i.e., in a range of from about 0.1% to about 0.2% atomic weight.

The crystals exhibit lower laser thresholds after treatment. For instance, the threshold for crystal B is about 42 millijoules prior to treatment and 8.6 millijoules after treatment. Also, the laser output increases. For crystal B, the laser output is about 46.5 milliwatts prior to treatment and 205 milliwatts after treatment. For crystal H, "in grown" bubbles cause internal scattering which inherently reduces Figure of Merit.

TABLE I

| Crystal | Dimensions, cm | | $Ti^{+3}$ Content |
|---|---|---|---|
| | Diameter | Length | |
| A | 0.61 | 6.8 | 0.05% atomic |
| B | 0.61 | 6.8 | 0.1% atomic |
| C | 0.61 | 5.0 | 0.08% atomic |
| D | 0.61 | 5.0 | 0.14% atomic |
| E | 0.70 | 3.0 | 0.05% atomic |
| F | 1.5 | 8.9 | 0.03% atomic |
| G* | 0.61 | 7.5 | 0.14% atomic |
| H | 0.61 | 7.5 | 0.24% atomic |

*Crystal as grown contained "in grown" bubbles

TABLE II

| Crystal | Atmosphere Ar. Vol. % | Atmosphere H2. Vol % | Pressure. atm. | Heating/Cooling Rate. °C./hr | Soak Time. hr | Soak Temp. °C. | Figure of Merit Before | Figure of Merit After |
|---|---|---|---|---|---|---|---|---|
| A | 80 | 20 | 1 | 100 | 43 | 1900 | 28.3 | 100 |
| B | 80 | 20 | 1 | 100 | 43 | 1900 | 9.5 | 156 |
| C | 51 | 49 | 1 | 50 | 40 | 1950 | 20 | 125 |
| D | 51 | 49 | 1 | 50 | 40 | 1950 | 35 | 210 |
| E | 50 | 50 | 1 | 50 | 60 | 1975 | 40 | 159 |
| F | 50 | 50 | 1 | 50 | 100 | 1970 | 20 | 930 |
| G | 50 | 50 | 1 | 50 | 100 | 1970 | 10 | 100 |
| H | 25 | 75 | 1 | 50 | 100 | 1945 | 30 | 227 |

TABLE III

| Crystal | Atmosphere Ar. Vol. % | Atmosphere H2. Vol % | Pressure. atm. | Heating/Cooling Rate. °C./hr | Soak Time. hr | Soak Temp. °C. | Figure of Merit Before | Figure of Merit After |
|---|---|---|---|---|---|---|---|---|
| $MgAlO_4$:Ti | 50 | 50 | 1 | 10 | 40 | 1870 | 0 | 150 |
| $YAlO_3$:Ti | 50 | 50 | 1 | 50 | 50 | 1780 | 25 | 100 |
| $Y_3Al_5O_{12}$:Ti | 50 | 50 | 1 | 50 | 50 | 1850 | 50 | 150 |
| $LaMgAl_{11}O_{19}$:Ti | 50 | 50 | 1 | 50 | 50 | 1830 | 65 | 200 |
| $GdScO_3$:Ti | 50 | 50 | 1 | 50 | 50 | 1950 | 0 | 103 |
| $ScBO_3$:Ti | 50 | 50 | 1 | 50 | 20 | 1750 | 10 | 100 |
| $Gd_3Sc_2Al_3O_{12}$:Ti | 50 | 50 | 1 | 20 | 50 | 1910 | 25 | 155 |

Only samples of these crystals were treated. Each sample was a 6 mm diameter cylinder. 10–20 mm long.

What is claimed is:

1. A method for enhancing a titanium doped oxide crystal suitable as a laser material comprising maintaining the crystal at a temperature of about 50° C. to about 80° C. below the melting point of the crystal in an inert atmosphere containing hydrogen in an amount of at least about 20 volume percent for a time sufficient to enhance the Figure of Merit of the crystal by at least 10 percent.

2. The method of claim 1, wherein the titanium-doped oxide crystal is selected from the group consisting of Ti:$MgAlO_4$, Ti:$YAlO_3$, Ti:$Y_3Al_5O_{12}$, Ti:$LaMgAl_{11}O_{19}$, Ti:$GdScO_3$, and Ti:$ScBO_3$.

3. The method of claim 1, wherein hydrogen is present in the atmosphere in an amount of at least about 40 volume percent.

4. The method of claim 1, wherein the crystal is maintained at a temperature of at least about 1750° C.

5. The method of claim 1, wherein the crystal contains from about 0.02 to 1.0 atomic percent titanium.

6. The method of claim 1, wherein the Figure of Merit of the crystal is enhanced to at least about 100.

7. A tunable titanium-doped oxide laser crystal other than sapphire having from about 0.02 to 1.0 atomic percent of titanium and a Figure of Merit of at least about 100.

8. A method for enhancing a laser crystal consisting essentially of an oxide crystal and titanium dopant for providing lasing capability comprising maintaining the crystal at a temperature of about 50° C. to about 80° C. below the melting point of the oxide crystal in an inert atmosphere containing hydrogen in an amount of at least about 20 volume percent for a time sufficient to enhance the Figure of Merit of the laser crystal by at least 10 percent.

* * * * *

UNITED STATES PATENT AND TRADEMARK OFFICE
CERTIFICATE OF CORRECTION

PATENT NO. : 4,988,402
DATED : January 29, 1991
INVENTOR(S) : M.R. Kokta

It is certified that error appears in the above-identified patent and that said Letters Patent is hereby corrected as shown below:

Columns 7 and 8:

Table III, column entitled "Heating/Cooling Rate, °C/hr", second to last entry, "50" should read --20--.

Table III, column entitled "Soak Time, hr", second to last entry, "20" should read --50--.

Signed and Sealed this

Sixth Day of October, 1992

Attest:

DOUGLAS B. COMER

Attesting Officer

Acting Commissioner of Patents and Trademarks